(12) United States Patent
Nguyen et al.

(10) Patent No.: US 10,346,274 B2
(45) Date of Patent: Jul. 9, 2019

(54) TESTING USING COUPLING EMULATION

(71) Applicant: Infineon Technologies Austria AG, Villach (AT)

(72) Inventors: Dinh Quoc Thang Nguyen, Villach (AT); Andrei Daniel Basa, Bucharest (RO); Dirk Hammerschmidt, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/192,048

(22) Filed: Feb. 27, 2014

(65) Prior Publication Data
US 2015/0242295 A1      Aug. 27, 2015

(51) Int. Cl.
*G06F 11/26* (2006.01)
*G06F 17/50* (2006.01)

(52) U.S. Cl.
CPC ........ *G06F 11/261* (2013.01); *G06F 17/5027* (2013.01)

(58) Field of Classification Search
CPC ............... G06F 11/261; G06F 11/3656; G06F 11/3652; G06F 17/5027; G06F 11/3636

USPC ........................................................... 703/28
See application file for complete search history.

(56) References Cited

U.S. PATENT DOCUMENTS

| | | | | |
|---|---|---|---|---|
| 5,596,742 A | * | 1/1997 | Agarwal | G06F 17/5027 326/37 |
| 7,099,818 B1 | * | 8/2006 | Nemecek | G06F 11/261 703/28 |
| 2012/0119765 A1 | * | 5/2012 | Bracker | H01M 10/42 324/750.01 |

OTHER PUBLICATIONS

Wave Digital Filters: Theory and Practice, Alfred Fettweis, Fellow, IEEE Invited Paper 1986.*
A Behavioral Model of A/D Converters Using a Mixed-Mode Simulator, Genhong Ruan, Member, IEEE, 1991.*
Fettweis, Alfred. "Wave Digital Filters: Theory & Practice." Proceedings of the IEEE, vol. 74, No. 2, Feb. 1986. 60 Pages.

* cited by examiner

*Primary Examiner* — Saif A Alhija
(74) *Attorney, Agent, or Firm* — Eschweiler & Potashnik, LLC

(57) ABSTRACT

An apparatus and method associated with testing are disclosed, where a coupling between a device under test and at least one further device may be emulated. The coupling may be a bus.

20 Claims, 9 Drawing Sheets

TESTING USING COUPLING EMULATION

FIELD

The present application relates to testing of devices using emulation.

BACKGROUND

Before devices, for example semiconductor devices, are manufactured and shipped to a customer, testing of the devices is performed in various stages of development and production to ensure that the device meets required specifications. Usually, in a first stage of developing a device, simulations are used where the device (referred to in the following as device under test, DUT) is simulated for example on a computer. While many problems may already be identified in such a simulation, simulations cannot rule out that errors or faults still occur in the real device. For example, nowadays for more complex devices computing power available is often not sufficient to provide a real time simulation to check real time behavior.

Therefore, for example prototypes of the device may be manufactured for testing during development, or final products may be tested in real time. However, devices may be used under a plurality of different circumstances like different loads, different temperatures, different further devices connected to the device etc., and it may be difficult to set up all possible environments with real devices to provide a comprehensive testing. Therefore, for example for testing an interaction of a device like a bus master with bus slaves like sensors, emulation of the bus slaves (for example sensors) may be used. For example, available emulators allow emulating up to two sensors for individual protocols like PSI5 or DSI3 for testing of bus master devices. Such emulators allow to vary parameters of the emulated devices (for example sensors) so as to test the DUT (for example bus master) under a plurality of different circumstances. However, existing emulation solutions may not be able to test a full parameter range required for example by a standard, as for example programming (emulation) of external components of the emulated devices (like sensors) may be very limited or non-existent.

DETAILED DESCRIPTION

In the following, various embodiments will be described with reference to the attached drawings. It is to be noted that these embodiments serve only illustrative purposes and are not to be construed as limiting the scope of the present application in any way. For example, while embodiments may be described as comprising a plurality of features or elements, in other embodiments some of these features or elements may be omitted, and/or some features may be replaced by alternative features or elements, for examples features or elements performing an equivalent function. Moreover, in some embodiments additional features or elements apart from the ones explicitly shown and described may be present.

Various features or elements from different embodiments may be combined unless specifically noted otherwise.

In some embodiments, a coupling between a device under test (DUT) and one or more further devices is emulated. Emulation in the context of the present application means that the coupling is not provided as in the final product, but digital computations are used to provide signals which correspond to the behavior of the actual coupling as close as possible. These digital calculations may be modified to emulate different types of couplings of different behavior of couplings. The emulation may for example be implemented in hardware, for example on a field programmable gate array (FPGA). The one or more further devices may also be emulated, may be real devices or may be a mixture of emulated and real devices. By providing an emulation of the coupling, different possible behaviors of the coupling, for example a coupling network, may be provided for testing without actually having to provide different types of coupling. In some embodiments, the device under test may be a bus master, the coupling which is emulated may comprise a bus and the one or more further devices may comprise one or more sensors. However, other devices than bus masters and sensors may also be used, bus masters and sensors merely being provided as illustrative examples.

Figure 1:
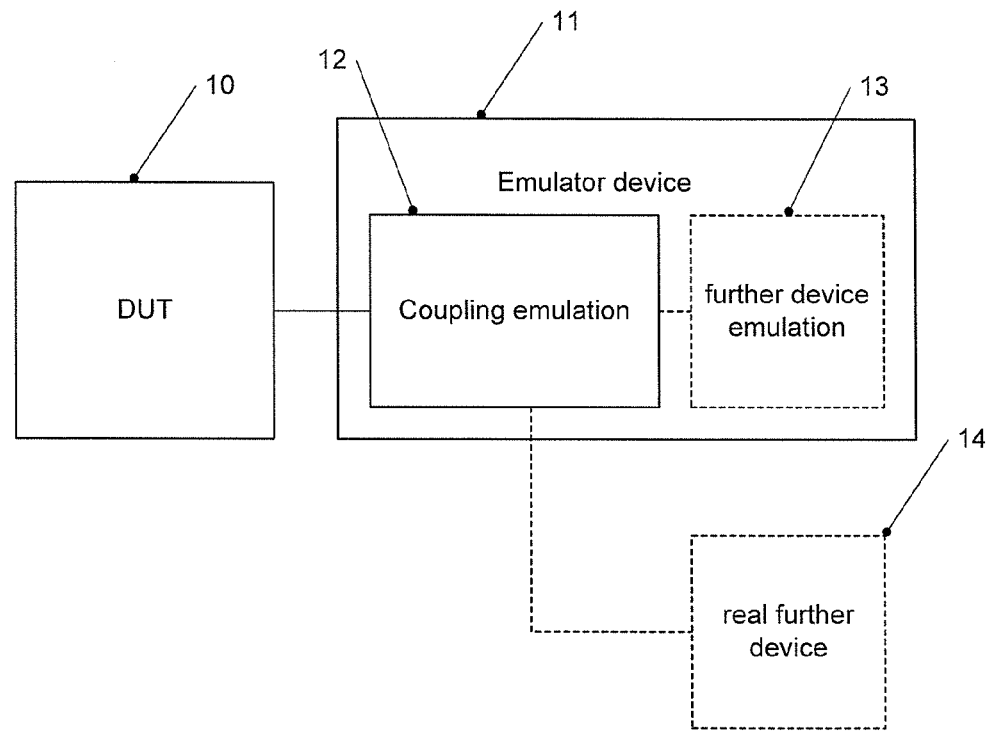
FIG. 1 is a block diagram of a test setup comprising an emulator device according to an embodiment.

Turning now to the figures, in FIG. 1 a test setup according to an embodiment comprising an emulator device 11 according to an embodiment is schematically shown. The test setup of FIG. 1 comprises a device under test (DUT) 10, which for example may be a bus master or a control device which is intended to interact with one or more further devices.

DUT 10 is coupled with the emulator device 11. Emulator device 11 may for example be realized in hardware, for example using a field programmable gate array (FPGA). For performing the emulation, wave digital filter structures may be used.

In embodiments, emulator device 11 receives signals from DUT 10 and provides signals to DUT 10 in real time, i.e. emulator device 11 approximates the behavior of real devices including timing.

Emulator device 11 comprises a coupling emulation part 12 emulating a coupling, e.g. a coupling network like a bus, between DUT 10 and further devices. For examples, coupling emulation 12 may emulate properties of wiring (e.g., bus wiring) like resistance (R), inductance (L), capacitance (C), propagation constants, wave impedance or wire length or any other parameter which describes a real physical coupling.

Furthermore, in some embodiments emulator device 11 may have a further device emulation part 13 which emulates a further device like a sensor to which DUT 10 is to be coupled in real operation. Additionally or alternatively, a real further device 14 may be coupled to coupling emulation 12. Also, more than one further device may be emulated and/or provided as a real device in some embodiments.

Parameters of coupling emulation 12 may be varied for example using a graphic user interface (GUI) or any other kind of user interface, such that DUT 10 may be tested with varying coupling behaviors.

In other words, in the setup of FIG. 1 one or more emulated further devices, one or more real further devices or a combination of the two may be used, depending on a desired application. Also, while not shown in FIG. 1, one more real further devices coupled directly with DUT 10 without a coupling emulation may be used in parallel to devices coupled via coupling emulation part 12.

In some embodiments, DUT 10 may be a bus master, and the further devices (emulated or real) may be sensors. In other embodiments, further device emulation 13 may emulate a bus master, or real further device 14 may be a bus master, and device under test 10 may comprise one or more sensors.

Figure 2:
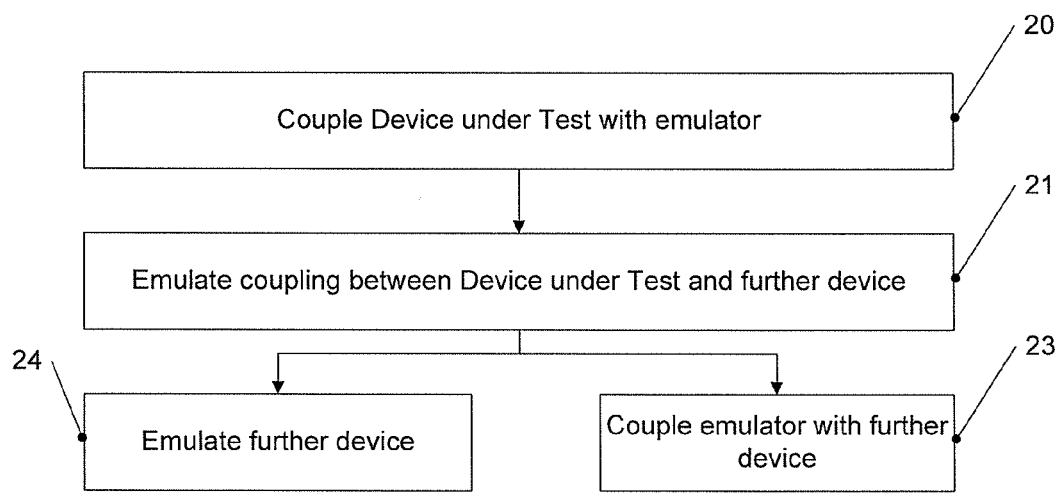
FIG. 2 is a flowchart illustrating a method according to an embodiment.

In FIG. 2, a flowchart illustrating a method according to an embodiment is shown. While the method of FIG. 2 is depicted and illustrated as a series of acts or events, the order in which such acts or events are described or illustrated is not to be construed as limiting. In particular, acts or events may occur in a different order than described, and/or acts or events may be performed simultaneously, possibly also simultaneously with additional acts or events not explicitly shown in FIG. 2. The method of FIG. 2 may be implemented using the setup of FIG. 1 or any of the setups or devices described later with reference to FIGS. 3-12, but may also be implemented independently therefrom.

At 20, a device under test (DUT) is coupled with an emulator. At 21, the emulator emulates a coupling between the device under test and at least one further device, for example emulate properties like resistance, inductance, capacitance, wire length, wave impedance and/or propagation constants of such a coupling. At 24, additionally the emulator may emulate one or more further devices coupled with the emulated coupling. Additionally or alternatively to 24, the emulator may be coupled with one or more real further devices. For testing, at 23 the emulated coupling emulated at 21 may be varied so as to test the device under test under various coupling scenarios. Also, in case a further device is emulated (24 in FIG. 2), parameters of the further device may be varied.

In the following, for further illustration some further test setups will be described where the device under test is a bus master, and further devices are sensors. However, bus masters and sensors as already mentioned above serve merely as illustrative examples, and application of the embodiments described is not limited to such devices.

Figure 3:
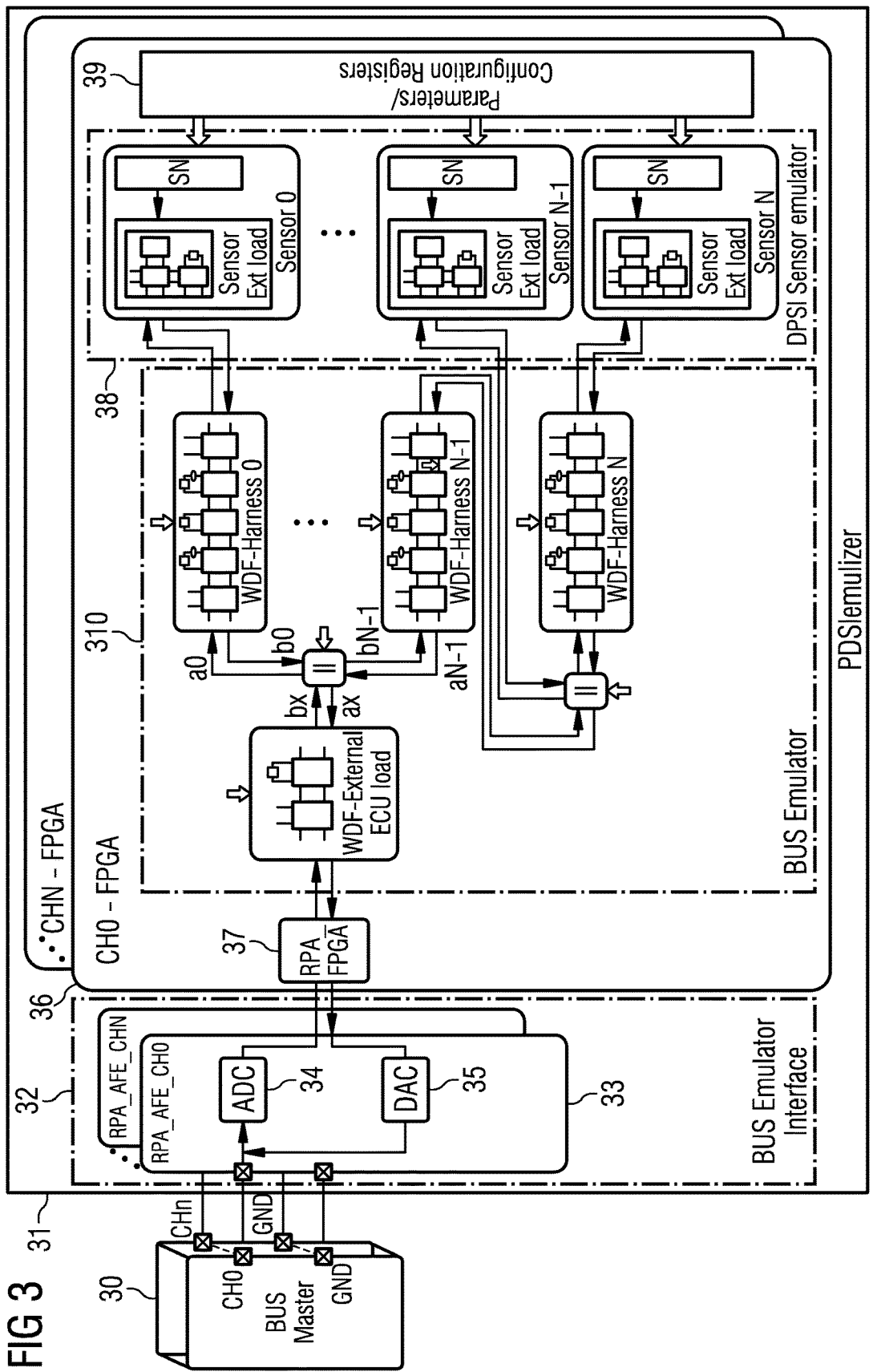
FIG. 3 is a detailed block diagram illustrating a test setup according to an embodiment.

In FIG. 3, a bus master 30 is coupled with an emulator 31 labeled PDSI emulizer, which in the embodiment shown emulates sensors 38 using a PSI or DSI protocol like PSI5 or DSI3. However, in other embodiments other kinds of protocols may be used for communication between sensors and bus master 30. Bus master 30 comprises a plurality of channels CH0 to CHN, each of which in the embodiment is coupled with a different part 33 of a bus emulator interface 32 (RPA_AFE-CH0 . . . RPA_AFE-CHN). Part 33 is also referred to as real part adapter (RPA) analog front end (AFE) part 33 herein. Each RPA AFE part 33 comprises an analog-to-digital converter (ADC) 34 and a digital-to-analog converter (DAC) 35. Using these converters, real signals from the bus master are converted to digital signals to be processed within emulator 31, and digital signals provided by emulator 31 are converted to real signals to be provided to bus master 30. GND designates a ground potential in FIG. 3.

Furthermore, in the embodiment of FIG. 3 for each channel an emulator portion 36 (CH0-FPGA . . . CHN-FPGA) is provided, which in the embodiment shown is implemented using a field programmable gate array (FPGA). It should be noted that different emulator portions 36 may be implemented on different FPGAs or on a common FPGA. Each emulator portion 36 comprises a real port adapter part 37, which together with real port adapter analog front end part 33 serves to convert signals to and from bus master 30 to and from signals usable within emulator 31. Real port adapter AFE part 33 and real port adapter part 37 together form an entity referred to as real port adapter (RPA) in the following. Implementation examples for such a real port adapter will be discussed later with reference to FIGS. 5-9 in more detail.

Real port adapter part 37 is coupled to a bus emulator 310 which emulates the behavior of a bus coupling bus master 30 with sensors 38. As shown in FIG. 3, bus emulator 310 comprises a part emulating a common part for all sensors 38 (labeled WDF external ECU load) as well as separate parts for all sensors for emulating wiring harnesses for each sensor (labeled WDF-harness 0 to WDF-harness N). For bus emulator 310, an emulation based on wave digital filters may be used, i.e. the individual blocks shown within bus emulator 310 may be or comprise wave digital filters (WDF). Furthermore, emulator portion 36 as already mentioned comprises a DPSI sensor emulator part 38 for emulating one or more sensors, N sensors in the example shown. Via a graphical user interface 39 comprising settable parameters or configuration registers, parameters or configurations for sensor emulator 38 and/or bus emulator 310 may be set. For example, for sensor emulator 30 protocol parameters of the PSI and/or DSI protocol may be set. For bus emulator 310, parameters like wiring harness length, resistance (R), inductance (L) and/or capacitance (C) parameters, desired connection topologies for a bus etc. may be set via user interface 39. It should be noted that one single graphical user interface may be provided to set parameters for all channels and therefore for all emulator portions 36, or separate interfaces may be provided. Furthermore, by emulating also the bus with bus emulator 310 a space saving on a lab workbench may be obtained, and a setup effort may be reduced compared to conventional setups where for example only a sensor is emulated, but the wiring harnesses for all sensors have to be provided for real and varied for real to allow an exact testing.

It should be noted that in some cases bus emulator 37 may mainly emulate a delay in case effects for example from wire inductance or capacitance or resistance are negligible. In other embodiments, also the effects of resistance, inductivity and capacitance may be modeled. Moreover, compared to a case where the wiring harness has to be provided for real, using a bus emulator provides an easier way to change settings, for example topology or wire length, for the wiring to provide comprehensive testing of bus master 30.

In the embodiment of FIG. 3, all sensors are emulated by emulator 31. In other embodiments, real sensors may be additionally or alternatively provided. Some examples for corresponding embodiments will next be described with reference to FIGS. 4 and 5.

Figure 4:
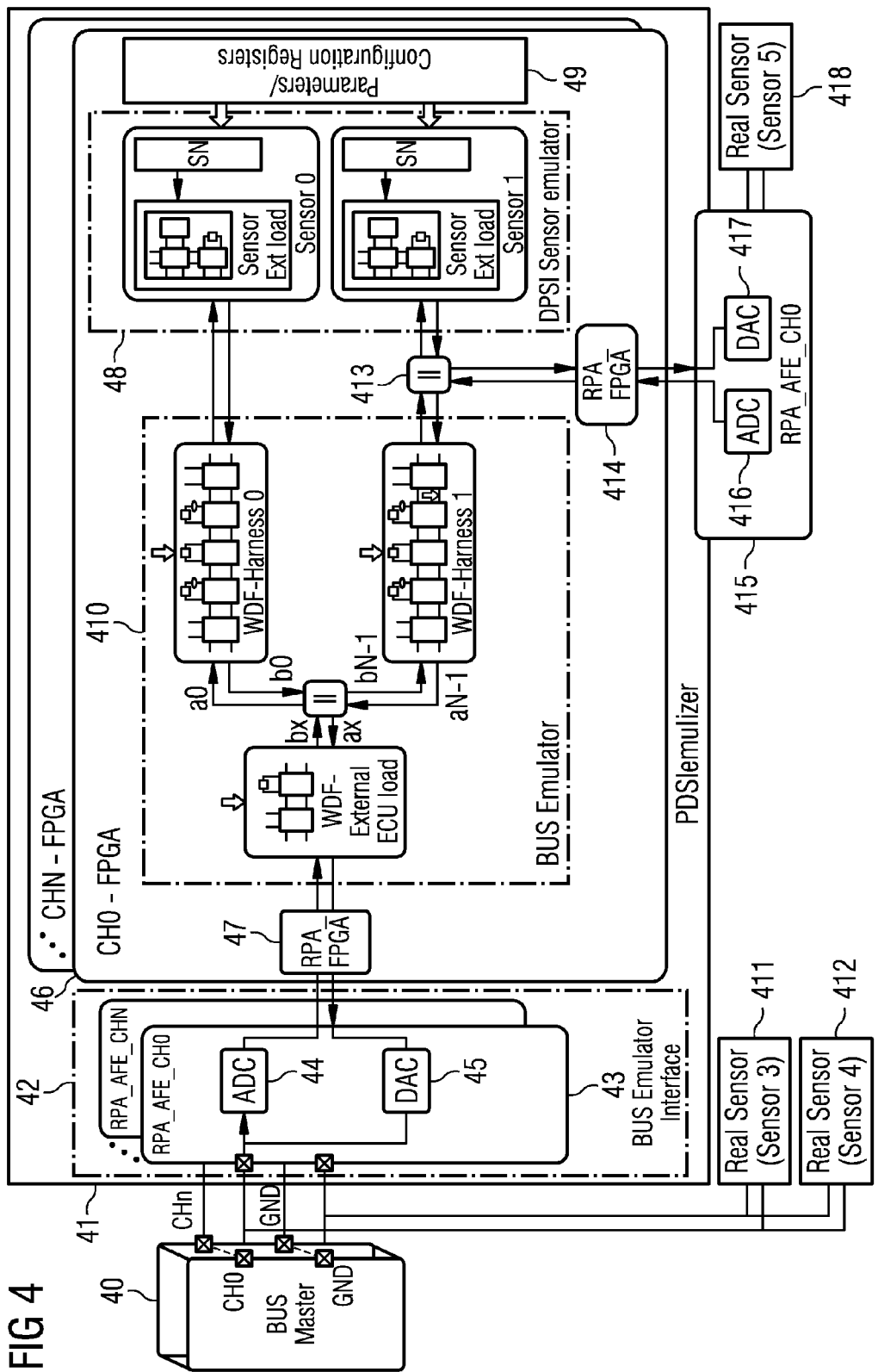
FIG. 4 is a detailed block diagram illustrating a test setup according to a further embodiment.

In the embodiment of FIG. 4, a bus master 40 is provided as a device under test which has a plurality of different channels CH0 to CHN, as already explained for bus master 30 of FIG. 3. GND again indicates a ground line. In the embodiment of FIG. 4, at least some channels (for example channel 0 in FIG. 4) are not only coupled to an emulator 41, but additionally to real sensors 411 and 412. Emulator 41 to a comparatively large extent corresponds to emulator 31 of FIG. 3, and corresponding parts will only briefly be described in the following, while differences will be explained in more detail.

Similar to bus emulator interface 32 of FIG. 3, emulator 41 comprises a bus emulator interface 42 with real port adapter analog front end parts 43 for each channel, each real port adapter analog front end part comprising an analog-to-digital converter 44 and a digital-to-analog converter 45. Furthermore, each channel emulator 41 comprises an emulator portion 46 comprising a bus emulator 410 and a DPSI sensor emulator 48 as well as a user interface 49, which largely correspond to bus emulator 37, sensor emulator 38 and user interface 39 of FIG. 3, respectively. Compared to FIG. 3, sensor emulator 48 emulates only two sensors, while other sensors are provided as real sensors, for example the already mentioned real sensors 411 and 412. Correspondingly, less WDF-harness portions are provided in bus emulator 410. Additionally, via a branch element 413 an additional real port adapter part 414 is coupled, which in turn is coupled with an additional real port adapter analog front end part 415. Real port adapter analog front end part comprises an analog-to-digital converter 416 and a digital-to-analog converter 417 and is coupled with a real sensor 418. Therefore, in the embodiment of FIG. 4 on a single channel (CH0) of bus master 40 real sensors are connected directly (411, 412), a real sensor is connected via an emulated bus (real sensor 418) and emulated sensors (48) are connected. The same may apply to other channels. On the other hand, each channel may also be configured differently, and any combination of real sensors coupled directly to the bus master, real sensors coupled via the bus emulator and emulated sensor may be used for each channel depending on requirements for a respective test. In this case, it is to be noted that "any number" also includes 0. For example, in FIG. 4 real sensors 411, 412 may be omitted, real sensor 418 may be omitted or one or both of the sensors emulated by sensor emulator 48 may be omitted.

Also, on some channels only real sensor directly coupled to the respective channel may be provided. A corresponding embodiment is shown in FIG. 5.

Figure 5:
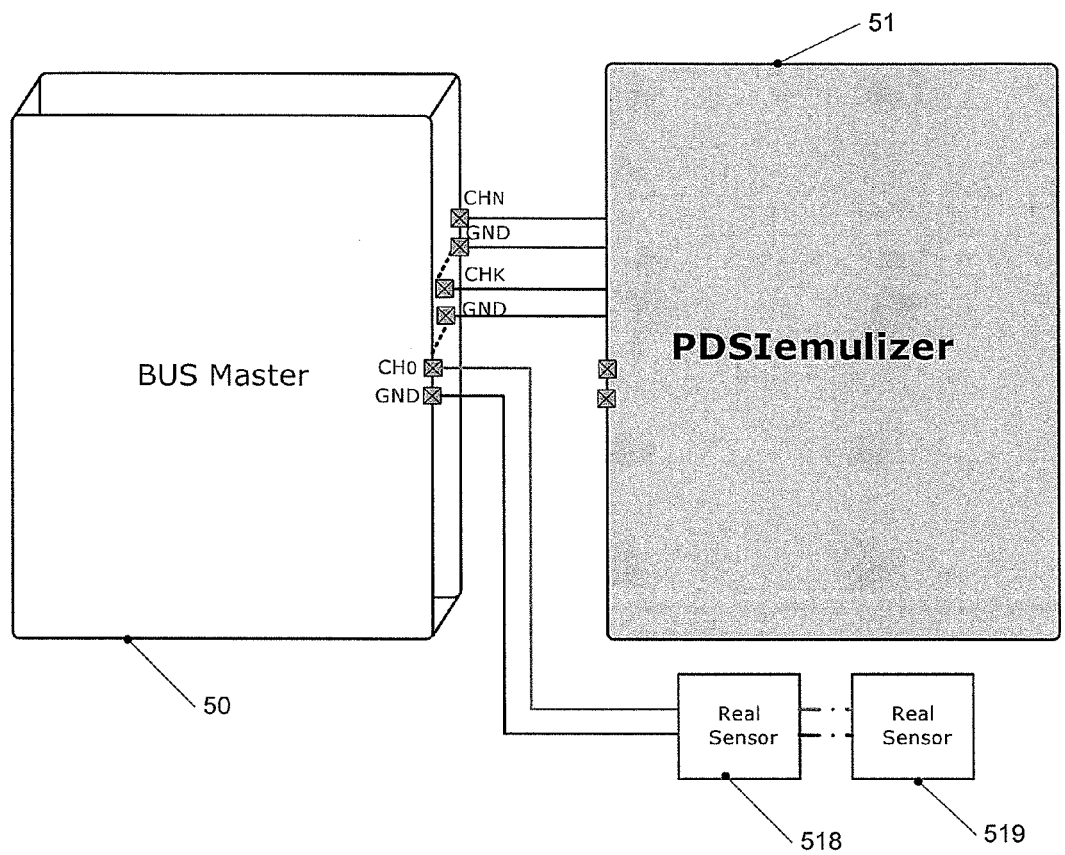
FIG. 5 is a block diagram illustrating a test setup according to an embodiment.

In the embodiment of FIG. 5, a bus master having a plurality of channels CH0 . . . CHK . . . CHN is provided. GND again indicates a ground line. On channel CH0, two real sensors 518 and 519 representing any desired number of real sensors up to a maximum supported by the channel of the bus are connected. In other words, in the example of FIG. 5 channel CH0 is not coupled with any emulation. On the other hand, channels CHK to CHN are coupled to an emulator 51, which may be configured for example as explained with respect to FIG. 3 for emulator 31 or with respect to FIG. 4 for emulator 41.

FIGS. 3-5 serve merely as illustrations that various configurations with various combinations of real sensors coupled directly to a bus master, real sensors coupled to a bus master via an emulator or emulated sensors are possible. In particular, other combinations than the ones described with reference to FIGS. 3-5 are equally possible.

It is to be noted that in configurations comprising real sensors, besides the bus master also the real sensors may be tested or, in other words, more than one device under test (DUT) may be present in embodiments. Furthermore, the test setups of FIGS. 3-5, besides testing the bus master or the sensors, may also be used to evaluate system behavior like timing, load effects, wiring harness effects on the system etc.

As already explained above, interfaces between the virtual emulation environment and real devices under test (DUT) or other devices are realized using analog-to-digital converters and digital-to-analog converters, which perform a bidirectional conversion between electrical signals of the real world and for example digital wave signals traveling backward and forward in case wave digital filters are used. As already mentioned, the corresponding adapters comprising the analog-to-digital converter (ADC) and the digital-to-analog converter (DAC) are also referred to as real port adapters in the context of the present application. Implementations of such real port adapters will be discussed now with reference to FIGS. 6-9 in some more detail.

Generally, in some embodiments the real port adapters are configured to measure either a voltage or a current at an output of the device under test and output the corresponding other value (current or voltage). Further inputs to the real port adapter are a reflective wave b coming from the emulator site, for example bus emulator, and a network input resistance $R_L$ of a first wave digital virtual port adapter. Finally the real port adapter calculates the input wave a which is fed to the emulator. The designation real port adapter (RPA) differentiates these adapters from virtual port adapters (VPA) which are conventionally used in wave digital filters. It should be noted that the term real port adapter is merely chosen to easily refer to an interface between real signals and emulator signals and does not indicate any particular technical realization of such an interface.

Figure 6:
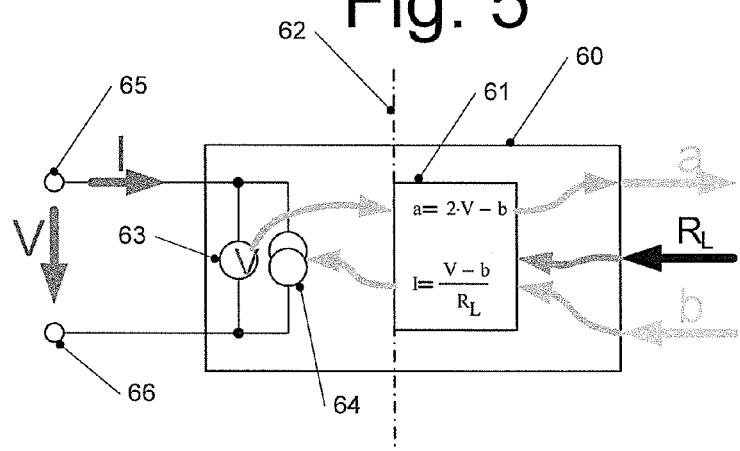
FIG. 6 is a diagram illustrating interfacing between a real device and an emulator according to an embodiment.

In FIG. 6 a real port adapter 60 according to an embodiment is shown. Real port adapter 60 may for example be used to implement RPA-AFE parts and other RPA parts of the embodiments previously described. A dot-dashed line 62 indicates the boundary between the emulator side (to the right in FIG. 6) and the "real world" side (on the left in FIG. 6).

Ports 65, 66 are for example coupled with a device under test, for example with connections CHx (x=0 . . . N) and GND of one of bus masters 30, 40 or 50 of the embodiments of FIGS. 3-5, or with real sensor 418 of the embodiment of FIG. 4. In the embodiment of FIG. 6, a voltage V is measured as represented by a voltmeter 63, and a current I is output by a current source 64. a represents a wave fed to the emulator, b represents a wave received from the emulator, and $R_L$ represents an input impedance of a first virtual port adapter of a wave digital filter of the emulator used.

Voltmeter 63 may for example be realized by an analog-to-digital converter converting a voltage between ports 65, 66 to a digital value. Current source 64 may for example be implemented by a digital-to-analog converter outputting a current, for example using a plurality of current sources which are activated by a digital input value, or any other conventional current source.

Calculations showing the relationships between a, $R_L$, b on the emulator side and I and V on the DUT side are shown in a box 61, namely a=2·V−b and $$I = \frac{V-b}{R_L}.$$

Therefore, a is calculated based on the received voltage V and the received wave b, and I, i.e. the output current, is calculated based on V, b and $R_L$.

The calculation functions of block 61 may be implemented on an FPGA, for example within the RPA parts 37, 47 or 414 already mentioned previously.

The embodiment of FIG. 6 may for example be used for devices under tests which use current sources, for example high impedance sources, to drive their outputs.

Figure 7A:
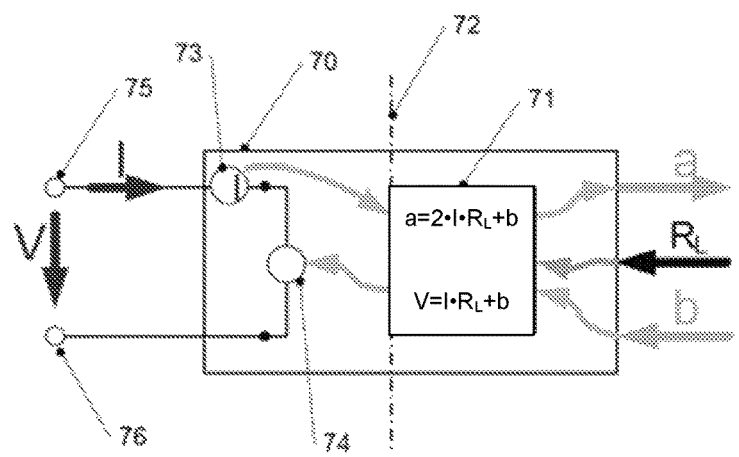
FIG. 7A is a diagram illustrating interfacing between a real device and an emulator according to a further embodiment.

A further embodiment of a real port adapter 70 is shown in FIG. 7A. A line 72 again represents a boundary between the emulator side (using wave digital signals) and the "real world" using current and/or voltage signals. In case of FIG. 7A, at port 75, 76 a current is received and converted to digital form via a current meter 73 (for example by measuring a voltage drop over a resistor through which the current flows), and a voltage V is output using a voltage source 74. On the emulator side, again a wave a is output, a wave b is received and an input resistance $R_L$ is provided. In this case, a and V are calculated as shown in a box 71, namely a=2·I·$R_L$+b and v=I·$R_L$+b. Box 71 may again be implemented as an FPGA like the RPA parts 37, 47 or 414 illustrated in FIG. 3 or 4.

Figure 7B:
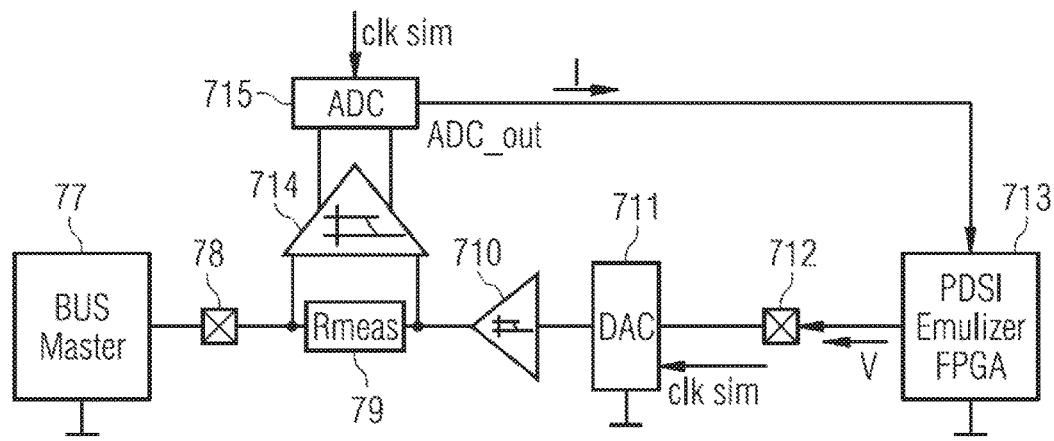
FIG. 7B is a diagram illustrating an implementation example of the interfacing of FIG. 7A according to an embodiment.

In FIG. 7B, a non-limiting implementation example of the real port adapter 70 of FIG. 7A is shown. In FIG. 7B, for illustration purposes the real port adapter couples a bus master 77 with an emulator 713, the emulator being implemented as FPGA. The calculations of box 71 of FIG. 7A in the example of FIG. 7B is also implemented in emulator 713.

Bus master 77 transmits signals to and receives signals from a terminal 78 of the real port adapter. Emulator 713 transmits a digital representation of the voltage V to a node 712. Voltage source 74 of FIG. 7A in the example of FIG. 7B is implemented as a digital-to-analog converter (DAC) 711 followed by a driver 710 to output the corresponding voltage to the "real world". Furthermore, current meter 73 of FIG. 7A is implemented by a measurement resistor 79, an amplifier/low pass filter 714 providing a gain and an analog-to-digital converter (ADC) 715. Amplifier/Low pass filter 714 amplifies and filters a voltage across the known measurement resistor 79, which voltage is proportional to the current to be measured. ADC 715 then converts the amplified and filtered voltage into a digital form to provide a digital representation of the current. DAC 711 and ADC 715 in the embodiment shown are clocked by a clock signal clk sim.

Figure 8:
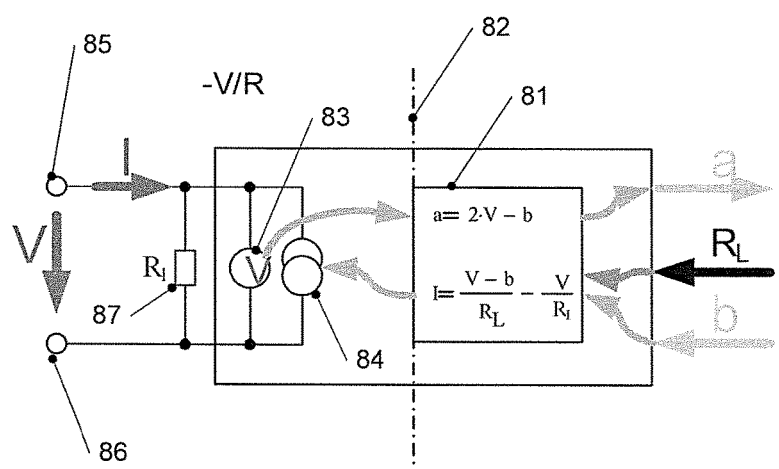
FIG. 8 is a diagram illustrating interfacing between a real device and an emulator according to an embodiment.

The above-described embodiments of real port adapters may be modified. For example, real passive elements may in some cases be provided. In FIG. 8, a modification of the embodiment of FIG. 6 with an additional input resistance $R_I$ 87 being present is shown. Corresponding modifications may also be applied to the embodiment of FIG. 7. Elements 81-86 of FIG. 8 essentially (apart from calculation in box 81) correspond to elements 60-66 of FIG. 6 and will therefore not be described in detail. Resistance 87 corresponds to a load to the output of the device under test parallel to the input of the emulation adapter. A behavior of the overall load of the device under test with the embodiment of FIG. 8 may be kept the same as the current flowing through the known resistor 87 may be subtracted from the simulated load current before it is delivered as a control value to current source 84. In particular, the values a and I in block 81 are calculated according to a=2·V−b and $$I = \frac{V-b}{R_L} - \frac{V}{R_I}.$$

As can be seen, the calculation for a is unchanged, while the calculation for I is modified based on the additional resistance $R_I$.

In this case, the added passive device (in this case resistor 87) is not visible in the overall behavior, and its influence is compensated in the port adapter. A behavior from a load side in this case is rather similar (i.e. FIGS. 6 and 8 show similar behavior). In some embodiments, the embodiment of FIG. 8 may have advantages regarding startup behavior, or requirements for ADCs or DACs used may be relaxed, compared to the embodiment of FIG. 6.

It should be noted that also other circuit elements like a capacitor may be used additionally or alternatively to resistance 87, i.e. coupled for example between ports 85, 86 of FIG. 8. This in embodiments changes only the correction of the output current I. For example if instead of resistor 87 a capacitor with a capacitance C would be used, the correction term would be C·dV/dt instead of V/$R_I$. In a case where a first element in the emulated coupling, for example coupling network, is a parallel capacitor as well, such a correction could also be performed by subtracting a capacitance value of an external capacitor from an internal capacitor.

Figure 9:
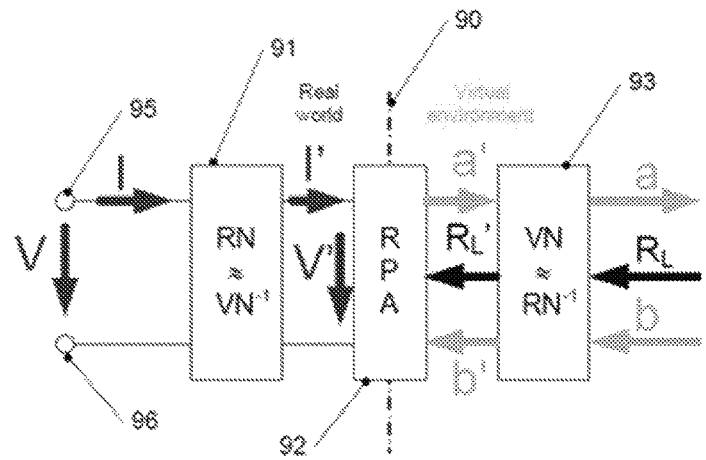
FIG. 9 is a diagram illustrating interfacing between a real device and an emulator according to an embodiment.

A generic case for such corrections is shown in FIG. 9. Here, between input ports 95 and 96 of a real port adapter 92, a real network 91 (for which resistor 87 of FIG. 8 is a simple example) is coupled. Real network 91 transforms between the signals at ports 95, 96 (I, V) and intermediate signals (I', V') at inputs of real port adapter 92. Such a network 91 may for example be used for specific purposes, for example may be implemented by a RLC network acting as an anti-aliasing filter. In order to minimize an influence of this real network 91, in some embodiments a virtual network 93 may be provided on the emulator side (i.e. virtual network 93 is an emulated network which may be seen as part of an emulated coupling) which approximately compensates the signal modifications performed by real network 91. In the example of FIG. 9 this is realized by converting intermediate waves a', b' that are delivered by or fed to real port adapter 92 into corrected waves a, b that are representations of the real world signals I, V with an accuracy as necessary or desired for a particular implementation. In embodiments, virtual network 93 may be implemented using one or more wave digital filters as mentioned above. It should be noted that in some embodiments the compensation may not be perfect, for example because real network 91 is a continuous time system, whereas virtual network 93 is on the digital side and therefore a discrete time system (for example clocked by a clock frequency). Furthermore, both real network 91 and virtual network 93 introduce a delay as they are causal systems (no reaction before the original signal). Therefore, to some extent, networks 91, 93 may have some effect on the overall behavior of the system even if they compensate each other to a large extent. It should be noted in other embodiments virtual network 93 may be omitted, for example in cases where the influence of real network 91 is significant only in a frequency range which is outside, for example above, a frequency or signal spectrum of communication signals used on the emulated bus.

Figure 10:
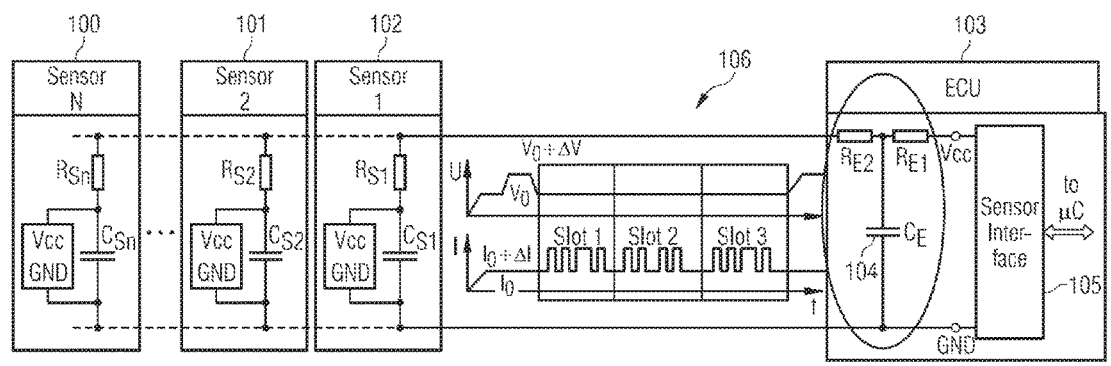
FIG. 10 illustrates a bus network with external components for electromagnetic compatibility (EMC) according to an embodiment.

In other embodiments, the emulated coupling, for example bus network, may be split into a real part and an emulated part. In other words, in such an embodiment only part of the coupling is emulated. In such an embodiment, the real part of the coupling may for example be a set of external components that are usually integrated on an electronic control unit or other kind of bus master, for example components like output resistors and capacitors that help to ensure electromagnetic compliance (EMC) of the unit or an interface thereof. An example of a setup using a sensor bus communicating according to a PSI5 protocol according to an embodiment is shown in FIG. 10. Here, an electronic control unit (ECU) acting as bus master is provided and may be seen as an example for a device under test. ECU 103 is coupled via a bus (which in an embodiment is emulated) signals of which are schematically shown at 106 with sensors 100-102. The number of sensors is not limited to three sensors as shown, but any number of sensors up to a maximum capacity of the bus may be used. ECU 103 comprises a sensor interface 105 coupled to a microcontroller (μC; not shown in FIG. 10) and an input network 104 comprising a capacitor and two resistors, which is an example of a real network integrated in a device under test. Such a network as network 104 in embodiments may also serve as an anti-aliasing filter, and as it is part of the real bus system (i.e. also present in real application) it does not introduce unwanted inaccuracies and delays. This may be advantageous in some applications or embodiments as in some cases the device under test, for example a bus master interface of ECU 103 comprised for example in sensor interface 105, may comprise a voltage regulator, and introduction of additional delays may change the stability in some cases. In this case, a real port adapter as described above, but without a virtual network like virtual network 93, may be employed.

Also, in some embodiments there may be further signal processing blocks included in the real port adapter, for example circuitry associated with digital-to-analog converters or analog-to-digital converters like the ones shown in FIGS. 3 and 4, for example noise shapers to extend a range of a digital-to-analog converter or decimation filters associated with a sigma-delta analog-to-digital converter. Decimators and interpolators in some embodiments may also be used to relax requirements for sampling frequencies of ADCs and DACs in cases where a sampling frequency on the emulator, i.e. in the digital signal processing, needs to be high for some reason. In other words, real port adapters may comprise additional components to the ones shown.

Figure 11:
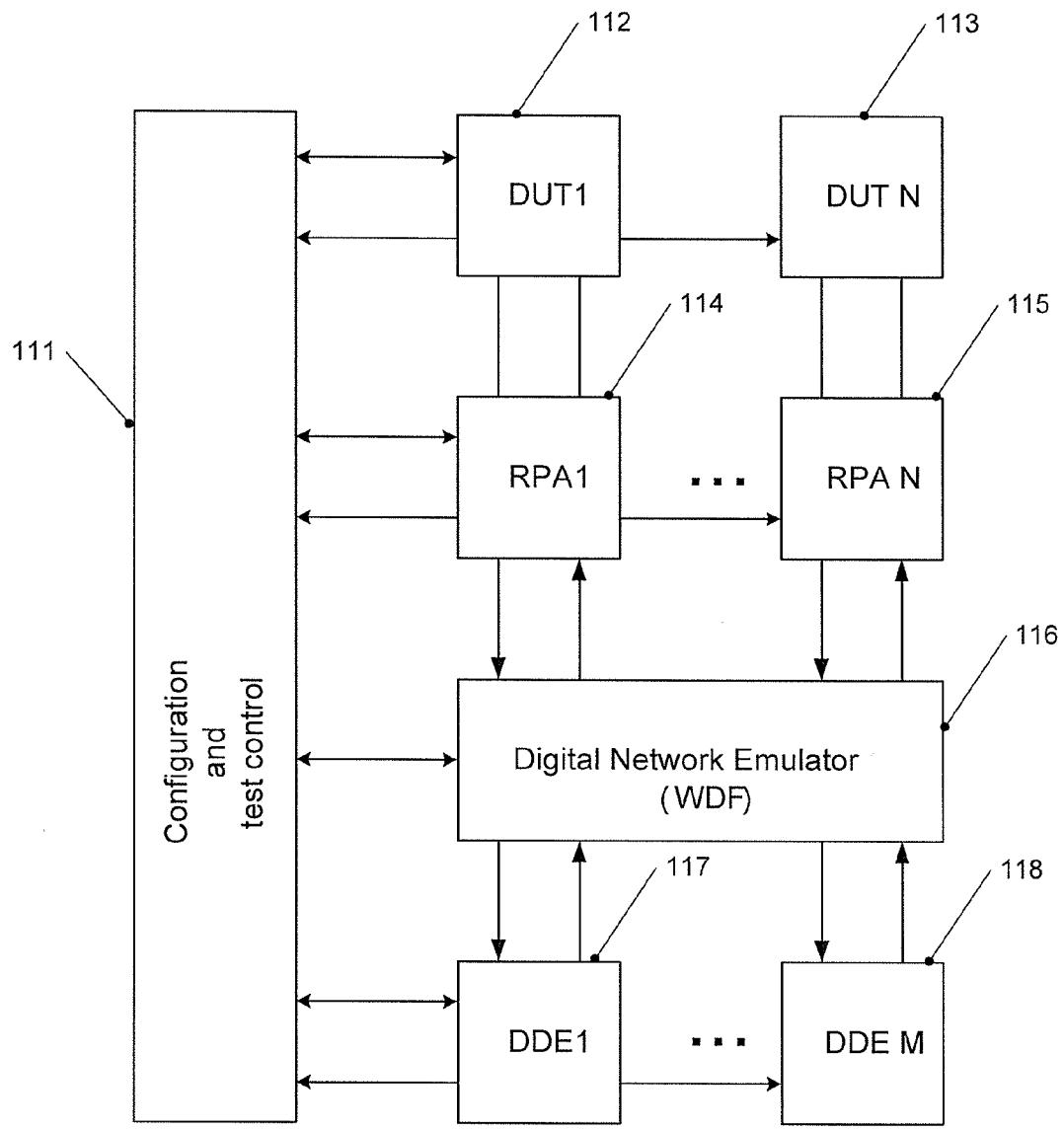
FIG. 11 is a block diagram illustrating a test setup according to an embodiment.

In FIG. 11, a generalized test system according to an embodiment is shown. The embodiment of FIG. 11 comprises one or more devices under test (DUT) 112, 113 which are coupled to an emulator for a digital network, i.e. a coupling, via real port adapters 114, 115. Network emulator 116 may use wave digital filters and may for example be implemented as described previously. Also, real port adapters 114, 115 may be implemented as described previously. Devices under test 112, 113 may for example comprise bus masters or other entities. Via real port adapters 114, 115 and network emulator 116, devices under test 112, 113 are coupled with digitally emulated devices (DDEs) 117, 118. For example, the emulated sensors of FIGS. 3 and 4 are examples for such digitally emulated devices. Therefore, in the embodiment of FIG. 11 the interconnection between the real and virtual (digitally emulated) devices is emulated by the digital network emulator 116. A configuration and test control 111 serves for controlling the other components to perform desired tests. For example, configuration and test control 111 may comprise a user interface for setting parameters to be used for testing, or may set such parameters automatically to perform an automatic test.

While two devices under test 112, 113, two real port adapters 114, 115 and two digitally emulated devices 117, 118 are explicitly shown in FIG. 11, the number of these components is not limited, and only one such component or more than two such components, respectively, may be present. The number of digitally emulated devices in this respect need not correspond to the number of devices under test or real port adapters. In embodiments, the digitally emulated devices and the network emulation as well as a digital port of real port networks (for example calculation blocks like blocks 61, 71 or 81 of FIGS. 6-8) may be implemented on a field programmable gat array (FPGA), a digital signal processor, computing equipment like a personal computer or combinations thereof. Also, configuration and test control 111 may be realized by software running on a computer, by firmware, by hardware or combinations thereof. In some embodiments, the configuration and test control 111 may compile and/or download a new code for a FPGA or DSP which includes the emulation of the DDEs, the digital network emulator and digital port of the RPAs to provide a desired emulation.

Figure 12:
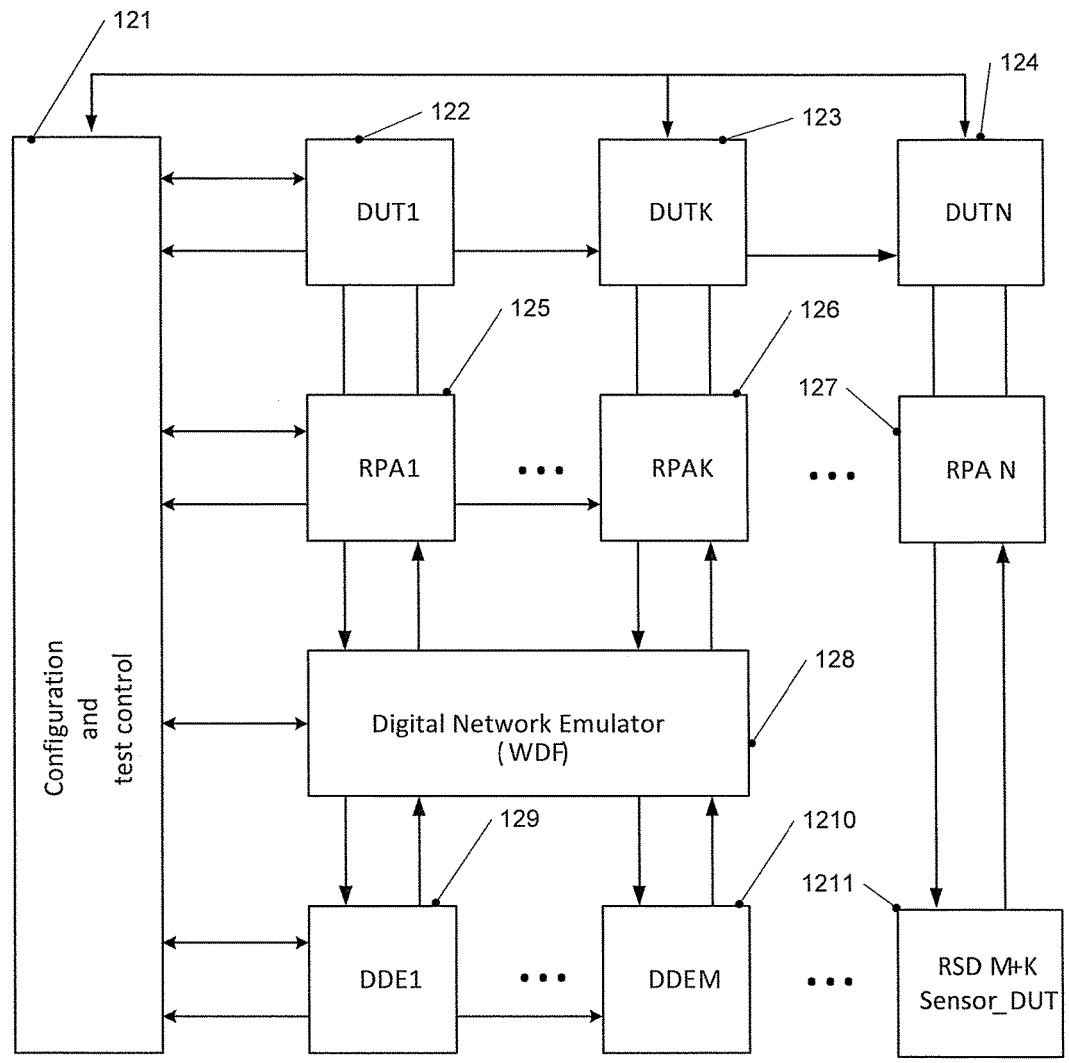
FIG. 12 is a diagram illustrating a test setup according to an embodiment.

A further embodiment is shown in FIG. 12, which is based on the embodiment of FIG. 11. Configuration and test control 121 of FIG. 12 corresponds to configuration and test control 111 of FIG. 11, DUTs 122, 123 correspond to DUTs 112, 113 of FIG. 11, RPAs 125, 126 correspond to RPAs 114, 115, digital network emulator 128 corresponds to digital network emulator 116 and DDEs 129, 1210 correspond to DDEs 117, 118. Therefore, these components will not be described again in detail. Variations and implementation examples discussed for these components with respect to FIG. 11 also apply to the embodiment of FIG. 12.

Additionally, the embodiment of FIG. 12 comprises one or more devices under test 124 which are coupled to real sensors 2111. In some embodiments, these couplings may be via network adapters 127 or real networks. In other embodiments, such couplings may be via digital network emulator 128, which was already described using examples for the embodiment of FIG. 4.

Also other configurations may be used, the configurations of FIGS. 11 and 12 being merely illustrative examples. It should also be noted that one or more of the digitally emulated devices may be components other than bus participants, for example injectors of distortion signals that allow to perform a virtual electromagnetic susceptibility test. Another possible function which a DDE may have in an embodiment is a virtual receiver of electromagnetic radiation or an electromagnetic limiter to analyze an electromagnetic behavior, for example electromagnetic emission that is created by a bus system or devices under test. It should also be noted that for example in the scenario of FIG. 12 also device 1211 may be a device under test, for example a sensor to be tested.

As can be seen from the above explanations, various modifications and alterations are possible to the described embodiments, which are therefore to be regarded as illustrative examples and not as limiting.

What is claimed is:
1. An emulator device, comprising:
 a port configured to couple a device under test with the emulation device in a coupling network, and
 an emulator configured to emulate at least part of a coupling between the device under test and at least one further device, wherein the port is configured to measure at least one of a current or a voltage applied to the port from the device under test and is configured to receive a reflected digital wave signal from the emulated part of the coupling network;

an analog-to-digital converter configured to convert the measured current or voltage to a first digital value;

a calculation block configured to calculate an input digital wave signal based on the first digital value and the reflected digital wave signal received from the emulated part of the coupling network, wherein the emulator is configured to emulate the at least part of the coupling by feeding the input digital wave signal to the emulated coupling network, wherein the calculation block is further configured to calculate a second digital value based on the first digital value and the reflected digital wave signal received from the emulated part of the coupling network, wherein the emulator is further configured to emulate an electrical response on the measured current or voltage by feeding the second digital value into a digital-to-analog converter, and wherein at least one of a voltage source or current source, complimentary to the measured current or voltage, is configured to apply at least one of a voltage or current, respectively, to the port based on an output of the digital-to-analog converter, wherein the output is based upon the feeding of the second digital value into the digital-to-analog converter.

2. The emulation device of claim 1, wherein the emulator comprises a field programmable gate array.

3. The emulation device of claim 1, wherein the emulator comprises wave digital filters.

4. The emulation device of claim 1, wherein the emulated at least part of a physical wiring comprises a bus.

5. The emulation device of claim 1, wherein the emulator emulates at least one of the at least one further devices, and wherein the emulated at least one of the at least one further devices comprises a sensor.

6. The emulation device of claim 1, wherein the properties of the physical wiring include at least one of a resistance, an inductance, a capacitance, a propagation constant, a wave impedance or a wire length.

7. The emulation device of claim 1, wherein the port comprises an analog-to-digital converter, a digital-to-analog converter and a calculation block configured to convert between digital waves, a voltage and a current.

8. The emulation device of claim 1, wherein the emulation device comprises at least one further port configured to couple at least one of the at least one further devices to the emulation device.

9. An apparatus, comprising:
a device, the device comprising:
a real port adapter, the real port adapter comprising an analog-to-digital converter, and a digital-to-analog converter,
a field programmable gate array, the field programmable gate array comprising a calculation block and a bus emulator configured to emulate a bus, wherein the field programmable gate array is coupled to the real port adapter,
wherein the real port adapter is configured to measure a current or voltage applied thereto from a device under test, and receive a reflected digital wave signal from the bus emulator, wherein the analog-to-digital converter is configured to convert the measured current or voltage to a first digital value, wherein the calculation block is configured to calculate an input digital wave signal based on the first digital value and the reflected digital wave signal, wherein the calculation block is further configured to calculate a second digital value based on the first digital value and the reflected digital wave signal, wherein the bus emulator is configured to emulate an electrical response on the measured current or voltage by feeding the second digital value into the digital-to-analog converter, and a voltage source or a current source, complimentary to the measured current or voltage, is configured to apply a voltage or current, respectively, to the real port adapter based on an output of the digital-to-analog converter, wherein the output is based upon the feeding of the second digital value into the digital-to-analog converter.

10. The apparatus of claim 9, wherein the device comprises a plurality of real port adapters and an associated plurality of bus emulators to be coupled to a plurality of channels of a device under test.

11. The apparatus of claim 9, wherein the field programmable gate array further comprises a sensor emulator.

12. The apparatus of claim 9, wherein the bus emulator comprises wave digital filters.

13. The apparatus of claim 9, further comprising a device under test coupled to the real port adapter.

14. The apparatus of claim 9, wherein the physical wiring properties include at least one of a resistance, an inductance, a capacitance, a propagation constant, a wave impedance or a wire length.

15. The apparatus of claim 13, further comprising at least one further device coupled with the device under test without use of the device.

16. The apparatus of claim 9, wherein the device comprises a further real port adapter configured to be coupled with a further device.

17. A method, comprising:
coupling a device under test with an emulator using a real port adapter, and
emulating a coupling between the device under test and at least one further device with the emulator, wherein the emulating comprises:
measuring a current or voltage applied to the real port adapter from the device under test;
receiving a reflected digital wave signal at the real port adapter from the emulator;
converting the measured current or voltage to a first digital value using an analog-to-digital converter;
calculating an input digital wave signal based on the first digital value and the reflected digital wave signal using the emulator;
emulating at least part of the coupling by feeding the input digital wave signal into the at least one further device;
calculating a second digital value based on the first digital value and the reflected digital wave signal using the emulator;
emulating an electrical response of the measured current or voltage by feeding the second digital value into a digital-to-analog converter; and
applying a voltage or current, complimentary to the measured current or voltage, to the real port adapter based on the output of the digital-to-analog converter, wherein the output is based upon the feeding of the second digital value into the digital-to-analog converter.

18. The method of claim 17, wherein emulating different properties of a physical wiring comprises emulating a bus.

19. The method of claim 17, wherein the properties of the physical wiring include at least one of a resistance, an inductance, a capacitance, a propagation constant, a wave impedance or a wire length.

20. The method of claim 17, further comprising coupling the emulator with at least one of the at least one further devices.

\* \* \* \* \*